United States Patent
Yankoski et al.

(10) Patent No.: US 8,063,440 B2
(45) Date of Patent: Nov. 22, 2011

(54) POWER ELECTRONICS POWER MODULE WITH IMBEDDED GATE CIRCUITRY

(75) Inventors: Edward P. Yankoski, Corona, CA (US); Terence G. Ward, Redondo Beach, CA (US); George R. Woody, Redondo Beach, CA (US)

(73) Assignee: GM Global Technology Operations LLC, Detroit, MI (US)

( * ) Notice: Subject to any disclaimer, the term of this patent is extended or adjusted under 35 U.S.C. 154(b) by 362 days.

(21) Appl. No.: 12/473,632

(22) Filed: May 28, 2009

(65) Prior Publication Data

US 2010/0302737 A1  Dec. 2, 2010

(51) Int. Cl.
*H01L 29/76* (2006.01)
*H01L 29/94* (2006.01)

(52) U.S. Cl. .......................... 257/330; 257/331; 257/334

(58) Field of Classification Search ........... 257/330–334
See application file for complete search history.

(56) References Cited

U.S. PATENT DOCUMENTS

| | | | | |
|---|---|---|---|---|
| 4,967,246 A | * | 10/1990 | Tanaka | 257/141 |
| 7,910,988 B2 | * | 3/2011 | Taketani | 257/330 |
| 2009/0224312 A1 | * | 9/2009 | Taketani | 257/330 |

* cited by examiner

*Primary Examiner* — Bao Q Vu
(74) *Attorney, Agent, or Firm* — Ingrassia Fisher & Lorenz P.C.

(57) ABSTRACT

A power electronics power module is provided. The power electronics power module includes an electrically conductive substrate, a electronic die having first and second opposing surfaces and at least one transistor formed thereon, the electronic die being mounted to the electrically conductive substrate and the at least one transistor being configured such that when the at least one transistor is activated, current flows from the first surface of the electronic die into the electrically conductive substrate, and a control member at least partially imbedded in the electrically conductive substrate, the control member having a control conductor formed thereon and electrically connected to the at least one transistor such that when a control signal is provided to the control conductor, the at least one transistor is activated.

20 Claims, 7 Drawing Sheets

POWER ELECTRONICS POWER MODULE WITH IMBEDDED GATE CIRCUITRY

TECHNICAL FIELD

The present invention generally relates to power converters, and more particularly relates to a power converter assembly with imbedded gate circuitry.

BACKGROUND OF THE INVENTION

In recent years, advances in technology, as well as ever-evolving tastes in style, have led to substantial changes in the design of automobiles. One of the changes involves the complexity of the electrical systems within automobiles, particularly alternative fuel (or propulsion) vehicles that utilize voltage supplies, such as hybrid and battery electric vehicles. Such alternative fuel vehicles typically use one or more electric motors, often powered by batteries, perhaps in combination with another actuator, to drive the wheels.

Such vehicles often use two separate voltage sources, such as a battery and a fuel cell, to power the electric motors that drive the wheels. Power electronics (or power electronics systems), such as direct current-to-direct current (DC/DC) converters, are typically used to manage and transfer the power from the two voltage sources. Also, due to the fact that alternative fuel automobiles typically include only direct current (DC) power supplies, direct current-to-alternating current (DC/AC) inverters (or power inverters) are also provided to convert the DC power to alternating current (AC) power, which is generally required by the motors.

Modern power converters typical utilize power modules that include electronic components, such as switches and diodes formed on semiconductor substrates. The electrical connections used to control the switches and diodes are often made using wire bonds of discrete wires. Such electrical connections often provide undesirable signal quality, are relatively fragile, and increase manufacturing time and costs.

Additionally, as the power demands on the electrical systems in alternative fuel vehicles continue to increase, there is an ever increasing need to maximize the electrical efficiency of such systems. There is also a constant desire to reduce the size of the components within the electrical systems in order to minimize the overall cost and weight of the vehicles.

Accordingly, it is desirable to provide a power electronics power module with improved electrical connections for the electronic components. Furthermore, other desirable features and characteristics of the present invention will become apparent from the subsequent description taken in conjunction with the accompanying drawings and the foregoing technical field and background.

SUMMARY OF THE INVENTION

A power electronics power module is provided. The power electronics power module includes an electrically conductive substrate, an electronic die having first and second opposing surfaces and at least one transistor formed thereon, the electronic die being mounted to the electrically conductive substrate and the at least one transistor being configured such that when the at least one transistor is activated, current flows from the first surface of the electronic die into the electrically conductive substrate, and a control member at least partially imbedded in the electrically conductive substrate, the control member having a control conductor formed thereon and electrically connected to the at least one transistor such that when a control signal is provided to the control conductor, the at least one transistor is activated.

An automotive power electronics power module is provided. The automotive power electronics power module includes an electrically conductive substrate, a plurality of electronic die having first and second opposing surfaces and at least one transistor formed thereon, each of the plurality of electronic die being mounted to the electrically conductive substrate such that the first surface thereof is substantially adjacent to the electrically conductive substrate and configured such that when the at least one transistor is activated, current flows from the first surface of the electronic die into the electrically conductive substrate, and at least one control member at least partially imbedded in the electrically conductive substrate, the at least one control member comprising a insulating portion and a control conductor formed on the insulating portion, the control conductor being electrically connected to the at least one transistor of each of the plurality of electronic die such that when a control signal is provided to the control conductor, the at least one transistor is activated.

A method for constructing an automotive power electronics power module is provided. An electrically conductive substrate having a plurality of grooves formed on a surface thereof is provided. At least a portion of at least one control member is fit into the plurality of grooves. The at least one control member includes an insulating portion and a control conductor formed on the insulating portion. A plurality of electronic die are mounted to the surface of the electrically conductive substrate. Each of the electronic die has first and second opposing surfaces and at least one transistor formed thereon and is arranged such that the first surface thereof is substantially adjacent to the electrically conductive substrate and over the control conductor.

DESCRIPTION OF THE DRAWINGS

The present invention will hereinafter be described in conjunction with the following drawing figures, wherein like numerals denote like elements.

DESCRIPTION OF AN EXEMPLARY EMBODIMENT

The following detailed description is merely exemplary in nature and is not intended to limit the invention or the application and uses of the invention. Furthermore, there is no intention to be bound by any expressed or implied theory presented in the preceding technical field, background, and brief summary, or the following detailed description.

The following description refers to elements or features being "connected" or "coupled" together. As used herein, "connected" may refer to one element/feature being mechanically joined to (or directly communicating with) another element/feature, and not necessarily directly. Likewise, "coupled" may refer to one element/feature being directly or indirectly joined to (or directly or indirectly communicating with) another element/feature, and not necessarily mechanically. However, it should be understood that although two elements may be described below, in one embodiment, as being "connected," in alternative embodiments similar elements may be "coupled," and vice versa. Thus, although the schematic diagrams shown herein depict example arrangements of elements, additional intervening elements, devices, features, or components may be present in an actual embodiment.

Further, various components and features described herein may be referred to using particular numerical descriptors, such as first, second, third, etc., as well as positional and/or angular descriptors, such as horizontal and vertical. However, such descriptors may be used solely for descriptive purposes relating to drawings and should not be construed as limiting, as the various components may be rearranged in other embodiments. It should also be understood that FIGS. 1-8 are merely illustrative and may not be drawn to scale.

FIG. 1 to FIG. 8 illustrate a power electronics power module according to one embodiment of the present invention. The power module may be used, for example, in a direct current-to-direct current (DC/DC) power converter or a direct current-to-alternating current (DC/AC) inverter assembly. The power module includes an electrically conductive substrate, an electronic die, and control member. The electronic die includes first and second opposing surfaces and at least one transistor formed thereon. The electronic die is mounted to the electrically conductive substrate and the at least one transistor is configured such that when the at least one transistor is activated, current flows from the first surface of the electronic die into the electrically conductive substrate. The control member is at least partially imbedded in the electrically conductive substrate and has a control conductor formed thereon that is electrically connected to the at least one transistor such that when a control signal is provided to the control conductor, the at least one transistor is activated.

Figure 1:
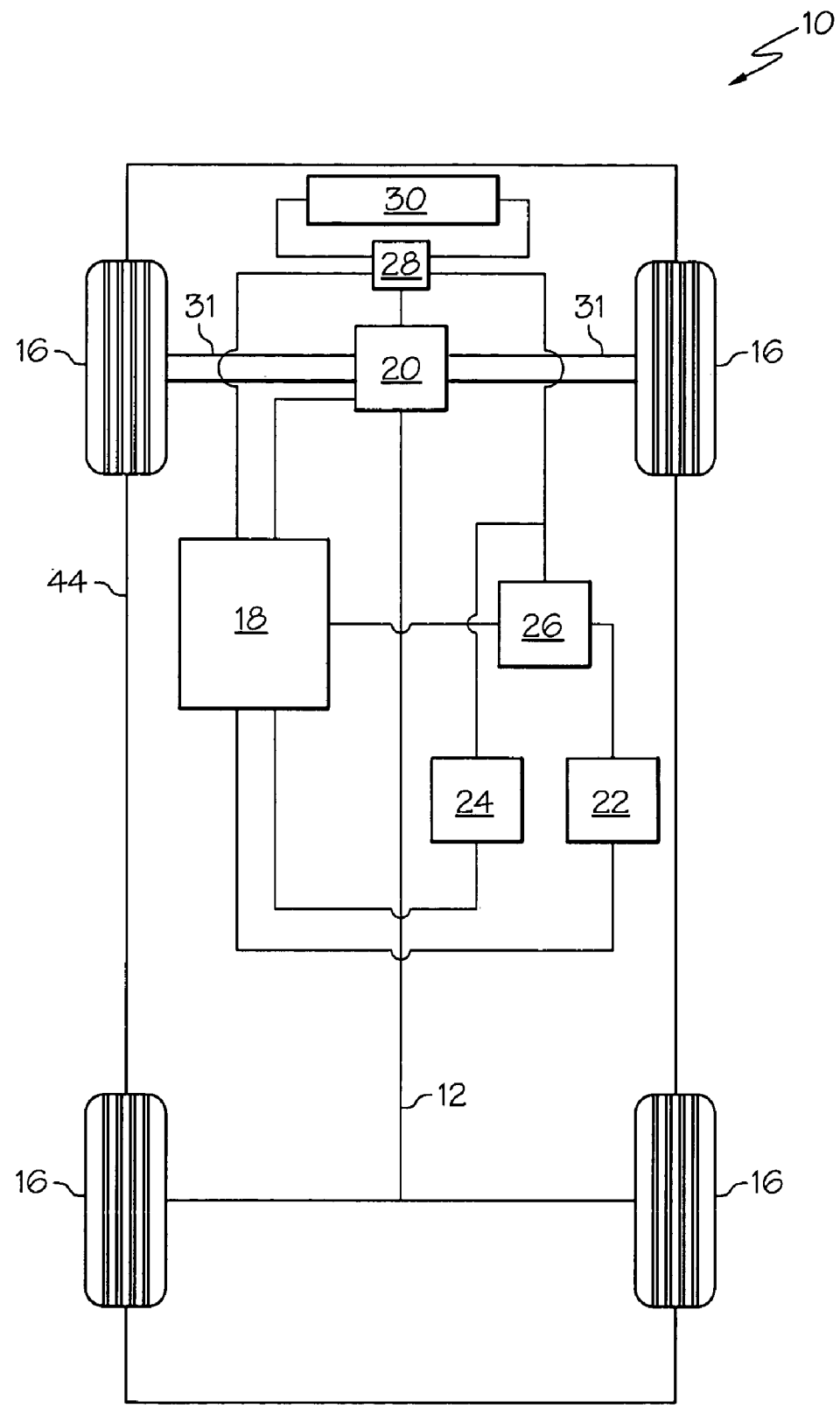
FIG. 1 is a schematic view of an exemplary automobile according to one embodiment of the present invention.

FIG. 1 illustrates a vehicle, or automobile 10, according to one embodiment of the present invention. The automobile 10 includes a chassis 12, a body 14, four wheels 16, and an electronic control system 18. The body 14 is arranged on the chassis 12 and substantially encloses the other components of the automobile 10. The body 14 and the chassis 12 may jointly form a frame. The wheels 16 are each coupled to the chassis 12 near a respective corner of the body 14.

The automobile 10 may be any one of a number of different types of automobiles, such as, for example, a sedan, a wagon, a truck, or a sport utility vehicle (SUV), and may be two-wheel drive (2WD) (i.e., rear-wheel drive or front-wheel drive), four-wheel drive (4WD), or all-wheel drive (AWD). The automobile 10 may also incorporate any one of, or combination of, a number of different types of engines, such as, for example, a gasoline or diesel fueled combustion engine, a "flex fuel vehicle" (FFV) engine (i.e., using a mixture of gasoline and alcohol), a gaseous compound (e.g., hydrogen and/or natural gas) fueled engine, a combustion/electric motor hybrid engine (i.e., such as in a hybrid electric vehicle (HEV)), and an electric motor.

In the exemplary embodiment illustrated in FIG. 1, the automobile 10 is a fuel cell vehicle, and further includes an electric motor/generator 20, a battery 22, a fuel cell power module (FCPM) 24, a DC/DC converter system (or a first power converter) 26, a DC/AC inverter (or a second power converter) 28, and a radiator 30. Although not illustrated, the electric motor/generator 20 (or motor) includes a stator assembly (including conductive coils), a rotor assembly (including a ferromagnetic core), and a cooling fluid (i.e., coolant), as will be appreciated by one skilled in the art. The motor 20 may also include a transmission integrated therein such that the motor 20 and the transmission are mechanically coupled to at least some of the wheels 16 through one or more drive shafts 31.

As shown, the battery 22 and the FCPM 24 are in operable communication and/or electrically connected to the electronic control system 18 and the DC/DC converter system 26. Although not illustrated, the FCPM 24, in one embodiment, includes, amongst other components, a fuel cell having an anode, a cathode, an electrolyte, and a catalyst. As is commonly understood, the anode, or negative electrode, conducts electrons that are freed from, for example, hydrogen molecules so that they can be used in an external circuit. The cathode, or positive electrode (i.e., the positive post of the fuel cell), conducts the electrons back from the external circuit to the catalyst, where they can recombine with the hydrogen ions and oxygen to form water. The electrolyte, or proton exchange membrane, conducts only positively charged ions while blocking electrons. The catalyst facilitates the reaction of oxygen and hydrogen.

Figure 2:
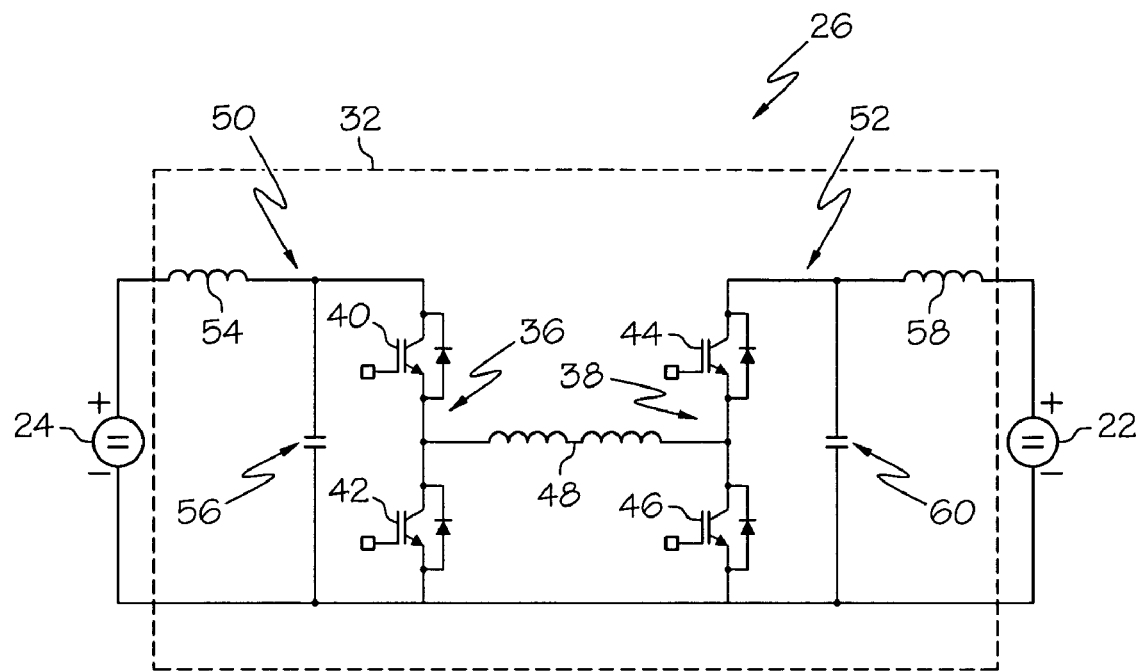
FIG. 2 is a schematic view of a direct current-to-direct current (DC/DC) power converter system within the automobile of FIG. 1.

FIG. 2 schematically illustrates the DC/DC converter system 26 in greater detail, in accordance with an exemplary embodiment of the present invention. In the depicted embodiment, the DC/DC converter system 26 includes a bi-directional DC/DC converter (BDC) 32 coupled to the FCPM 24 and the battery 22. The BDC converter 32, in the depicted embodiment, includes a power switching section with two dual insulated gate bipolar transistor (IGBT) legs 36 and 38, each having two IGBTs, 40 and 42, and 44 and 46, respectively. The two legs 36 and 38 are interconnected at midpoints by a switching inductor (or switching inductors, as described below) 48 having an inductance. The BDC converter 32 also includes a first filter 50 connected to the positive rail of the first IGBT leg 36 and a second filter 52 connected to the positive rail of the second IGBT leg 38. As shown, the filters 50 and 52 include a first inductor 54, a first capacitor 56, a second inductor 58, and a second capacitor 60, respectively. The first IGBT leg 36 is connected to the FCPM 24 through the first filter 50, and the second IGBT leg 38 is connected to the battery 22 through the second filter 52. As shown, the FCPM 24 and the battery are not galvanically isolated, as the negative (−) terminals are electrically connected.

Although not shown, the DC/DC converter system 26 may also include a BDC controller in operable communication with the BDC converter 32. The BDC controller may be implemented within the electronic control system 18 (FIG. 1), as is commonly understood in the art.

Figure 3:
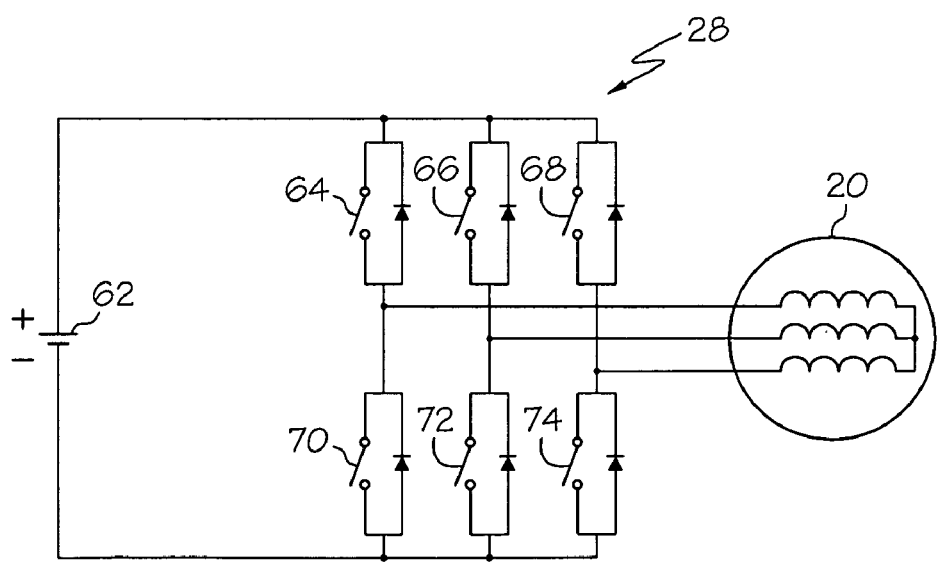
FIG. 3 is a schematic view of a direct current-to-alternating current (DC/AC) power inverter system within the automobile of FIG. 1.

FIG. 3 schematically illustrates the DC/AC inverter 28 in greater detail, in accordance with an exemplary embodiment of the present invention. The inverter 28 includes a three-phase circuit coupled to the motor 20. More specifically, the inverter 28 includes a switch network having a first input coupled to a voltage source 62 (e.g., the battery 22 and/or the FCPM 24 through the DC/DC converter system 26 and an output coupled to the motor 20). Although a single voltage source is shown, a distributed direct current (DC) link with two series voltage sources may be used.

The switch network comprises three pairs of series switches (e.g., IGBTs) with antiparallel diodes (i.e., antiparallel to each switch) corresponding to each of the phases. Each of the pairs of series switches comprises a first switch, or transistor, (i.e., a "high" switch) 64, 66, and 68 having a first terminal coupled to a positive electrode of the voltage source 62 and a second switch (i.e., a "low" switch) 70, 72, and 74 having a second terminal coupled to a negative electrode of the voltage source 62 and having a first terminal coupled to a second terminal of the respective first switch 64, 66, and 68.

Although not shown, the DC/AC inverter 28 may also include an inverter control module, which may be implemented within the electronic control system 18 (FIG. 1), as is commonly understood in the art.

The BDC 32 and the inverter 28 may also include a plurality of power module devices, each including a semiconductor substrate, or electronic die, with an integrated circuit formed thereon, amongst which the switches 40-46 and 64-74 are distributed, as is commonly understood.

Referring again to FIG. 1, the radiator 30 is connected to the frame at an outer portion thereof and although not illustrated in detail, includes multiple cooling channels therethough that contain a cooling fluid (i.e., coolant) such as water and/or ethylene glycol (i.e., "antifreeze") and is coupled to the motor 20 and the inverter 28. In one embodiment, the inverter 28 receives and shares coolant with the electric motor 20. The radiator 30 may be similarly connected to the inverter 28 and/or the electric motor 20.

The electronic control system 18 is in operable communication with the motor 20, the battery 22, the FCPM 24, the DC/DC converter system 26, and the inverter 28. Although not shown in detail, the electronic control system 18 includes various sensors and automotive control modules, or electronic control units (ECUs), such as the BDC controller, the inverter control module, and a vehicle controller, and at least one processor and/or a memory which includes instructions stored thereon (or in another computer-readable medium) for carrying out the processes and methods as described below.

FIGS. 4-8 illustrate a power electronics power module 80, according to one embodiment of the present invention. In one embodiment, the power module 80 is utilized within the inverter 28. However, it should be understood that the power module 80 may also or alternatively be utilized in the BDC 32, as will be appreciated by one skilled in the art.

The power module 80 includes an AC bus bar 82, a DC bus bar 84, and a negative bus bar 86. The AC bus bar 82 is substantially plate-shaped member, or substrate, having an upper surface 88 and a lower surface 90. The AC bus bar 82 is made of an electrically conductive material, such as copper, and although not shown, includes one or more fluid conduits extending therethrough that are in fluid communication with the radiator 30. The AC bus bar 82 also includes three AC terminals 92 connected to one end of the electric traction motor thereof.

Figure 4:
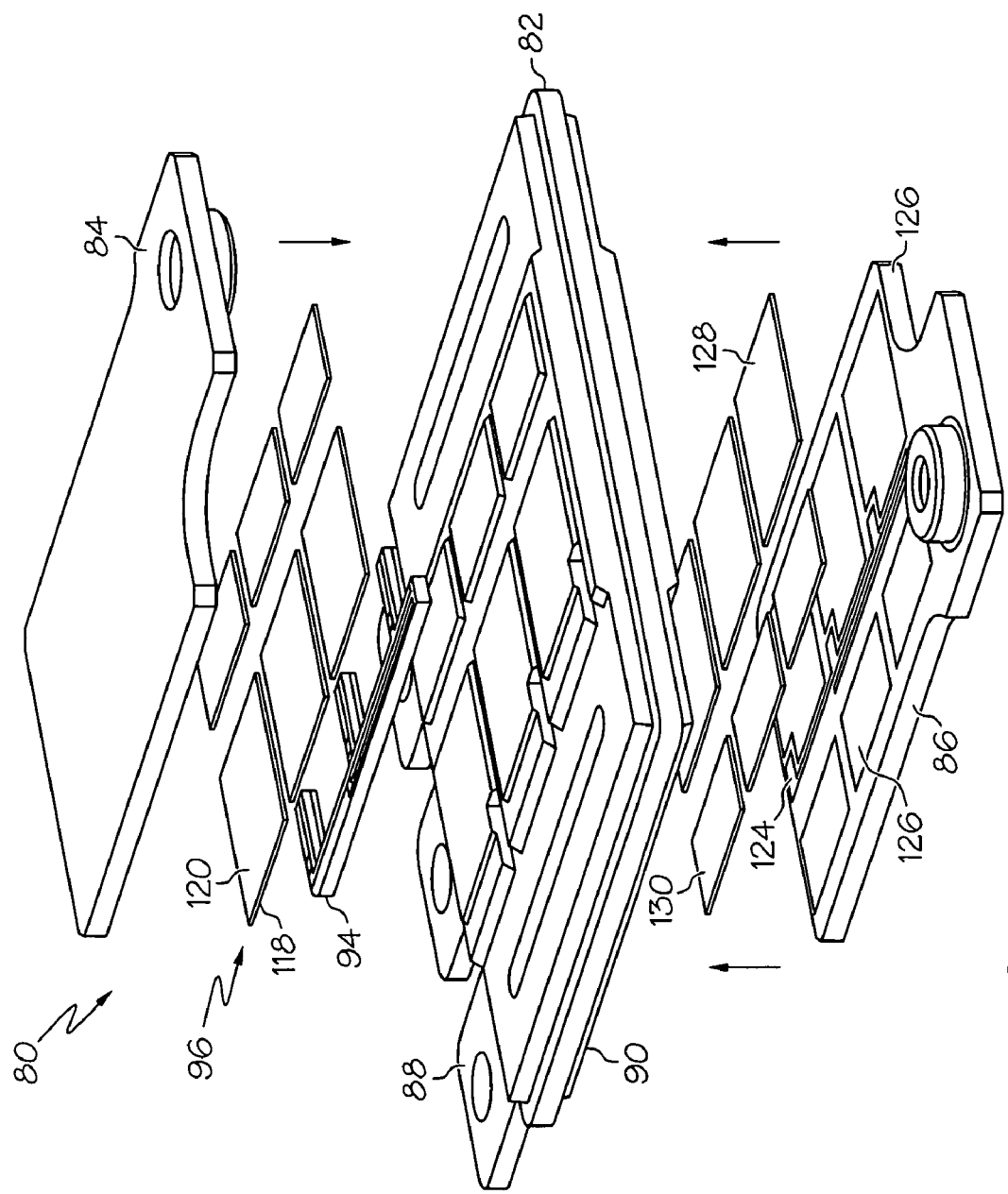
FIG. 4 is an exploded isometric view of a power module according to one embodiment of the present invention.
Figure 5:
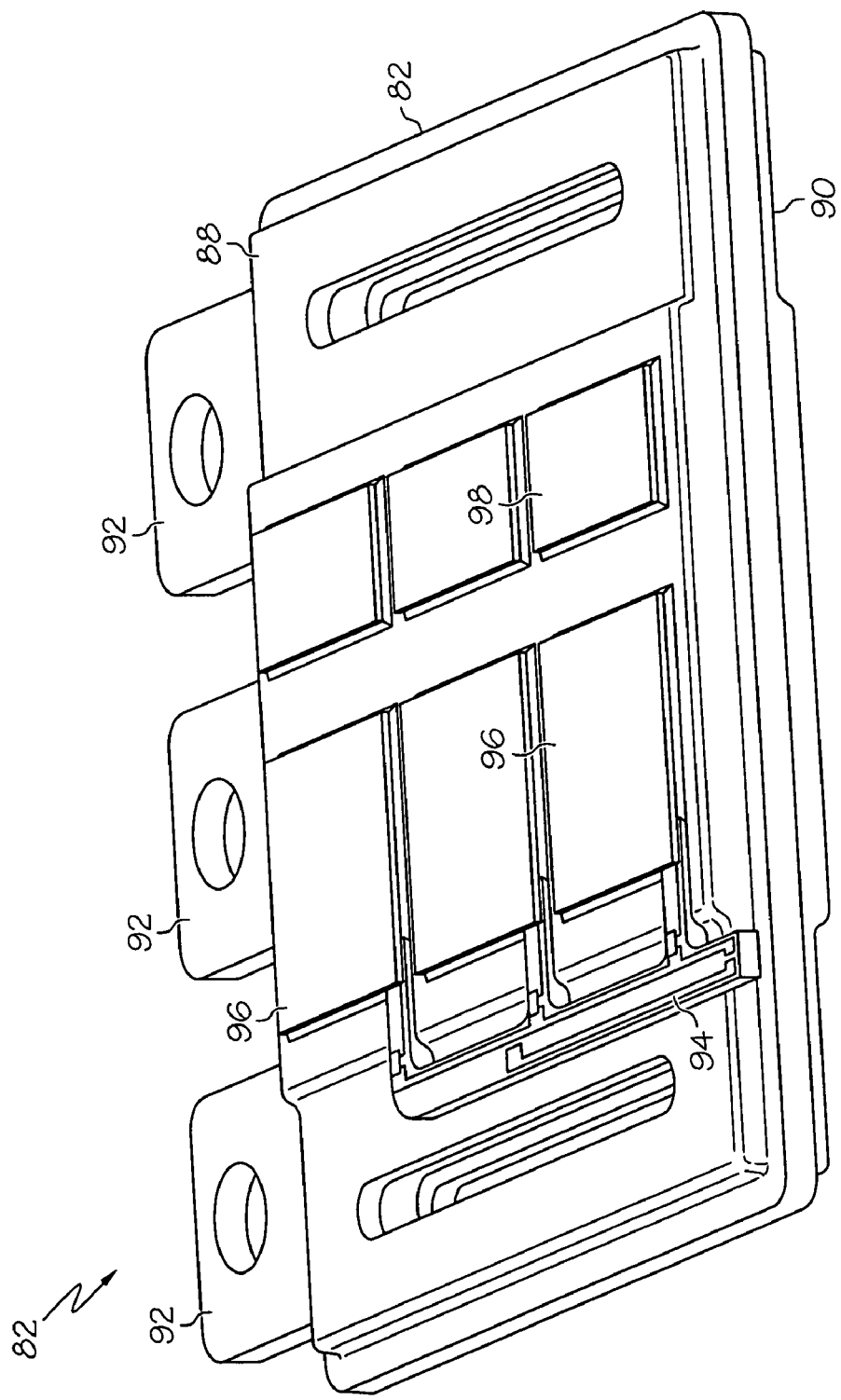
FIG. 5 an isometric view of an AC bus bar within the power module of FIG. 4.

Referring to FIGS. 4 and 5, on the upper surface 88 of the AC bus bar 82 are a gate control member 94 and various electronic components, including transistor die 96 and diode die 98.

Figure 6:
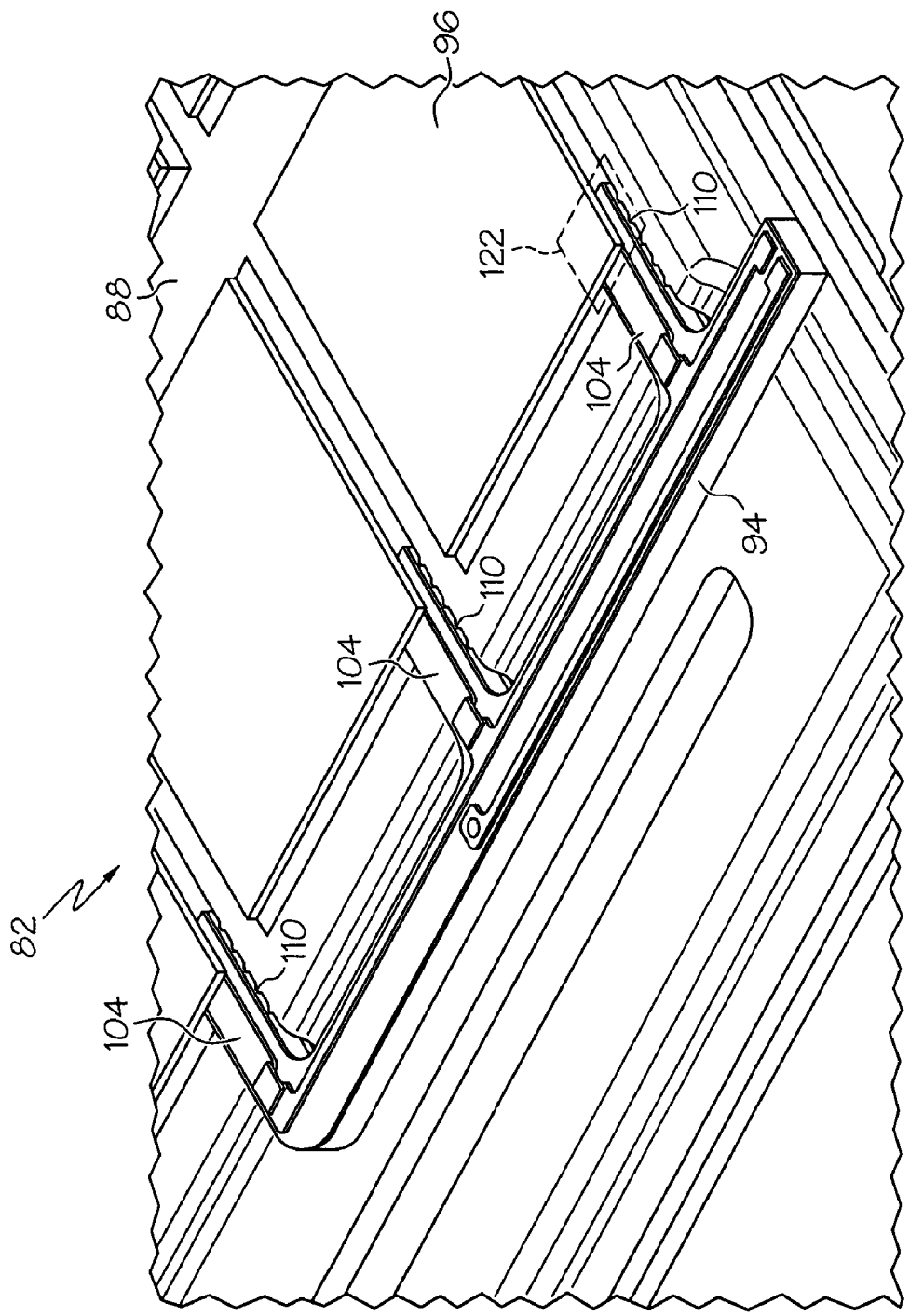
FIGS. 6, 7, and 8 are isometric views of portions of the AC bus bar of FIG. 5.
Figure 7:
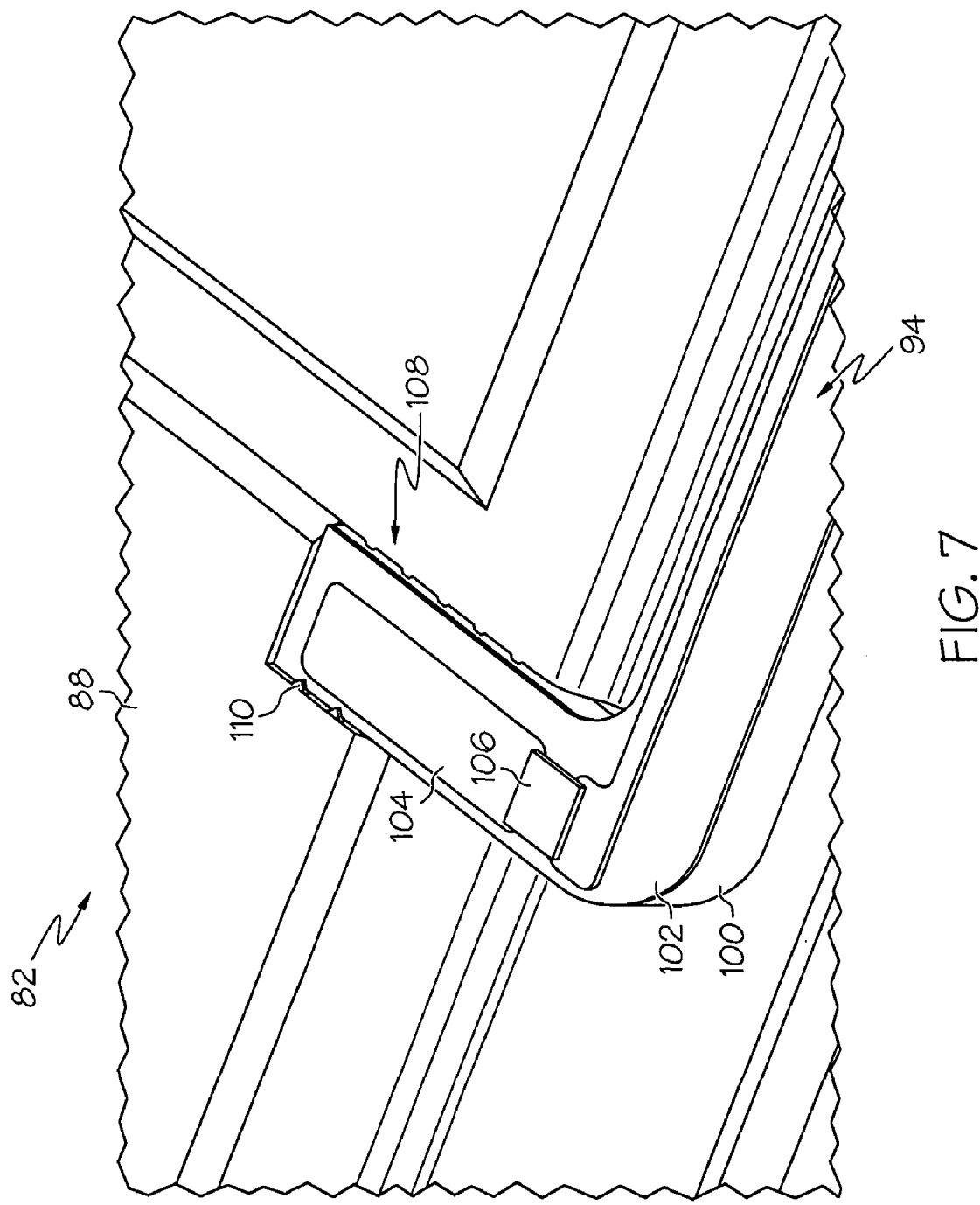

Referring to FIGS. 6 and 7, in one embodiment, the gate control member 94 is formed from an insulated metal substrate (IMS), as is commonly understood, and includes a base layer 100, a dielectric layer 102, and a gate control conductor (or lead) 104. The base layer 100 may be made of copper or aluminum and have a thickness of, for example, approximately 1.0 millimeter (mm). The dielectric layer 102 may lie on the base layer 100 and, be made of, for example, an epoxy-based material and have a thickness of approximately 100 micrometers (μm). The gate control conductor 104 may also be made of, for example, copper with a thickness of approximately 100 μm. In the depicted embodiment, the gate control member also includes a gate control conductor resistor 106 (e.g., made of tungsten) interconnecting separated portions of the gate control conductor 104.

In the example shown, the gate control member 94 is substantially in the shape of the letter "E" with contact portions 108 being at least partially imbedded in the upper surface 88 of the AC bus bar 82. In particular, the contact portions 108 are press fit into grooves 110 formed in the upper surface 88 of the AC bus bar 82, as shown in FIG. 8.

Figure 8:
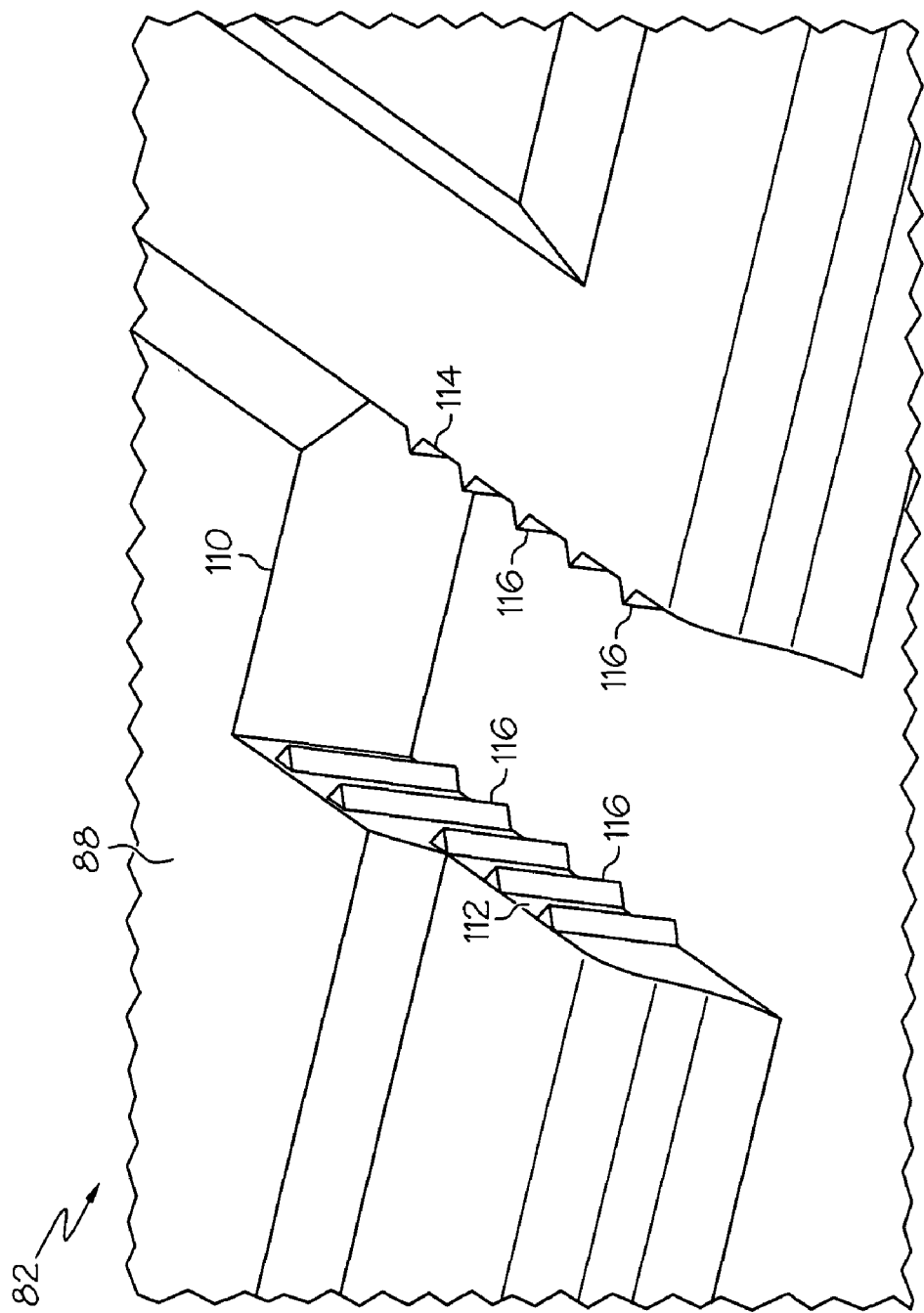

Still referring to FIG. 8, the grooves 110 have opposing inner surfaces 112 and 114 that have an alternating series of raised and recessed formations (e.g., serrations or teeth) thereon. In one embodiment, the grooves 110 have a width that is substantially the same as a width of the contact portions 108 of the gate contact member 94 such that the contact portions 108 are "swedged," as is commonly understood, into the grooves 110. Other embodiments may have the contact portions 108 soldered or otherwise bonded into the grooves 110.

In the depicted embodiment, the grooves 110 also have a depth that is substantially the same as the overall thickness of the gate contact member 94 such that the gate control conductor 104 may be pressed into the grooves 110 until it is substantially co-planar (or "flush") with the portions of the upper surface 88 of the AC bus bar 82 that are adjacent to the grooves 110.

In the embodiment shown, the electronic components include three transistor die 96 and three diode die 98. The transistor die 96 have first and second opposing surfaces (or sides) 118 and 120 and are mounted to the AC bus bar 82 with the first surfaces 118 "facing," or adjacent to, the upper surface of the AC bus bar 82. That is, the first surface 118 of each transistor die 96 is positioned between the second surface 120 thereof and the upper surface 88 of the AC bus bar 82.

Each of the transistor die 96 includes an integrated circuit formed thereon (or therein) that includes one or transistors (or switches), each of which includes a base (or gate), a collector (or drain), and an emitter (or source), as is commonly understood. The collector of the transistors is electrically connected to the second side 120 of each respective transistor die 96, while the emitter and base of each is electrically connected to the first side 118 of each respective transistor die 96, with the base being connected to a corner region 122 of the first side 118 as shown in FIG. 6 for the upper switch. In a similar manner, each of the diode die 98 includes an integrated circuit formed thereon than includes one or more diodes that are electrically connected to the AC bus bar 82. As such, the transistor die 96 and the diode die 98 mounted to the upper surface 88 of the AC bus bar 82 may be understood to jointly form one of the upper switch/diode combinations 64, 66, or 68 shown in FIG. 3.

Referring again to FIG. 6, the transistor die 96 are mounted (e.g., via soldering) to the upper surface 88 of the AC bus bar 82 such that they at least partially overlap the gate control conductors 104. In particular, the corner portions 122 of the first sides 118 of the transistor die 96 overlap and are electrically connected to the portions of the gate control conductors 104 within the grooves 110.

Referring again to FIG. 4, the DC bus bar 84, in the depicted embodiment, is a substantially plate-shaped member connected to the second surfaces 120 of the transistor die, as well as the diode die 98. The DC bus bar 84 is made of an electrically conductive material, such as copper.

The negative bus bar 86 is also a substantially plate-shaped member. In one embodiment, the negative bus bar 86 is made of an IMS, similar to the gate control member 94, with a similar gate control conductor 124 formed thereon, as well as exposed regions 126 of the corresponding base layer.

Similar to the upper surface 88 of the AC bus bar 82, three transistor die 128 and three diode die 130 (similar to respective die 96 and 98) are mounted to the negative bus bar 86, at the exposed regions 126. Although not specifically shown, the first sides of the transistor die 128 "face" or are adjacent (or electrically connected) to the negative bus bar 86, with corner regions being in contact with the gate control conductor 124, and the second sides are electrically connected to the lower surface 90 of the AC bus bar 82.

As such, the transistor die 128 and the diode die 130 mounted to the negative bus bar 86 may be understood to jointly form one of the lower switch/diode combinations 70, 72, or 74 shown in FIG. 3.

Thus, the power module 80 may substantially form one of the switch legs of the inverter 28 corresponding to one phase of operation of the electric motor 20 (FIG. 3). Although not shown, the gate control conductors 104 and 124 are electrically connected to the inverter control module within the electronic control system 18, while the DC bus bar 84 and the negative bus bar 86 are electrically connected to the voltage source 62 (e.g., the battery 22 and/or the FCPM 24) and the AC terminals 92 are electrically connected to the electric motor 20.

During operation, referring to FIG. 1, the automobile 10 is operated by providing power to the wheels 16 with the electric motor 20 using power from the battery 22 and FCPM 24 in an alternating manner and/or with the battery 28 and the electric motor 20 simultaneously using the inverter 28 and/or the BDC 26, in a known manner.

One advantage of the power module described above is that the various electrical connections to and from the electronic components may be made without using wire bonds or discrete wires. As a result, signal quality, particularly of the gate control signals used to operate the switches, is improved, as is durability, while manufacturing time and costs are reduced.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. A power electronics power module comprising;
    an electrically conductive substrate;
    an electronic die having first and second opposing surfaces and at least one transistor formed thereon, the electronic die being mounted to the electrically conductive substrate and the at least one transistor being configured such that when the at least one transistor is activated, current flows from the first surface of the electronic die into the electrically conductive substrate; and
    a control member at least partially imbedded in the electrically conductive substrate, the control member having a control conductor formed thereon and electrically connected to the at least one transistor such that when a control signal is provided to the control conductor, the at least one transistor is activated.

2. The power electronics power module of claim 1, wherein the first surface of the electronic die is positioned between the electrically conductive substrate and the second surface of the electronic die.

3. The power electronics power module of claim 2, wherein the at least one transistor comprises a collector, a base, and an emitter, the base of the at least one transistor is electrically connected to the control conductor, and the emitter of the at least one transistor is electrically connected to the first surface of the electronic die.

4. The power electronics power module of claim 3, wherein control conductor is positioned between the electronic die and the electrically conductive substrate.

5. The power electronics power module of claim 4, wherein the electrically conductive sleeve comprises a groove and the control member is press fit into the groove.

6. The power electronics power module of claim 5, wherein the control member further comprises and insulating portion positioned between the electrically conductive substrate and the control conductor.

7. The power electronics power module of claim 6, wherein the base of the at least one transistor is electrically connected to the first surface of the electronic die.

8. The power electronics power module of claim 7, wherein the electronic die is mounted to the electrically conductive substrate such that at least a portion of the first surface of the electronic die is adjacent to the groove.

9. The power electronics power module of claim 8, wherein the groove comprises first and second opposing inner surfaces, each of the first and second surfaces comprising an alternating series of raised and recessed formations thereon.

10. The power electronics power module of claim 9, wherein the control member is swedged, soldered, bonded, or a combination thereof into the groove such that the control conductor is substantially planar with a surface of the electrically conductive substrate.

11. An automotive power electronics power module comprising;
    an electrically conductive substrate;
    a plurality of electronic die having first and second opposing surfaces and at least one transistor formed thereon, each of the plurality of electronic die being mounted to the electrically conductive substrate such that the first surface thereof is substantially adjacent to the electrically conductive substrate and configured such that when the at least one transistor is activated, current flows from the first surface of the electronic die into the electrically conductive substrate; and
    at least one control member at least partially imbedded in the electrically conductive substrate, the at least one control member comprising a insulating portion and a control conductor formed on the insulating portion, the control conductor being electrically connected to the at least one transistor of each of the plurality of electronic die such that when a control signal is provided to the control conductor, the at least one transistor is activated.

12. The automotive power electronics power module of claim 11, wherein the at least one transistor of each of the plurality of electronic die comprises a base, a collector, and an emitter, the base and the emitter being electrically connected to the first surface of the respective electronic die.

13. The automotive power electronics power module of claim 12, wherein at least a portion of the control conductor is positioned between the first surface each of the plurality of electronic die and the electrically conductive substrate.

14. The automotive power electronics power module of claim 13, wherein the electrically conductive substrate is a heat sink.

15. The automotive power electronics power module of claim 14, wherein the electrically conductive substrate comprises a plurality of grooves formed therein, each of the plurality of grooves being adjacent to a respective one of the electronic die, and wherein a portion of the at least one control member is press fit into each of the plurality of grooves.

16. A method for constructing an automotive power electronics power module, the method comprising:
   providing an electrically conductive substrate having a plurality of grooves formed on a surface thereof;
   fitting at least a portion of at least one control member into the plurality of grooves, the at least one control member comprising an insulating portion and a control conductor formed on the insulating portion; and
   mounting a plurality of electronic die to the surface of the electrically conductive substrate, each of the electronic die having first and second opposing surfaces and at least one transistor formed thereon, each of the plurality of electronic die being arranged such that the first surface thereof is substantially adjacent to the electrically conductive substrate and over the control conductor.

17. The method of claim 16, wherein the at least one transistor comprises a collector, a base, and an emitter, the base of the at least one transistor is electrically connected to the control conductor, and the emitter of the at least one transistor is electrically connected to the first surface of the electronic die.

18. The method of claim 17, wherein each of the plurality of grooves comprises first and second opposing surfaces, each of the first and second surfaces comprising an alternating series of raised and recessed formations thereon.

19. The method of claim 18, wherein a portion of the at least one control member is swedged into each of the grooves.

20. The method of claim 19, wherein the at least one control member comprises an insulated metal substrate.

* * * * *